(12) United States Patent
Wirtl

(10) Patent No.: US 8,053,949 B2
(45) Date of Patent: Nov. 8, 2011

(54) ELECTRONIC CONTROL DEVICE FOR A PIEZO-CERAMIC BENDING TRANSDUCER DESIGNED AS A TRIMORPH

(75) Inventor: Hannes Wirtl, Schongau (DE)

(73) Assignee: Festo AG & Co. KG, Esslingen (DE)

( * ) Notice: Subject to any disclaimer, the term of this patent is extended or adjusted under 35 U.S.C. 154(b) by 392 days.

(21) Appl. No.: 12/310,060

(22) PCT Filed: Aug. 11, 2007

(86) PCT No.: PCT/EP2007/007119
§ 371 (c)(1),
(2), (4) Date: Feb. 9, 2009

(87) PCT Pub. No.: WO2009/021530
PCT Pub. Date: Feb. 19, 2009

(65) Prior Publication Data
US 2011/0163631 A1 Jul. 7, 2011

(51) Int. Cl.
*H01L 41/09* (2006.01)
(52) U.S. Cl. ......... 310/317; 310/318; 310/319; 310/332
(58) Field of Classification Search .................. 310/317, 310/318, 319, 332
See application file for complete search history.

(56) References Cited

U.S. PATENT DOCUMENTS

| | | | | |
|---|---|---|---|---|
| 4,099,211 A | * | 7/1978 | Hathaway | 360/292 |
| 4,916,349 A | | 4/1990 | Kornrumpf | |
| 5,933,061 A | * | 8/1999 | Takamoro et al. | 333/189 |
| 6,060,813 A | * | 5/2000 | Nowak | 310/314 |
| 7,215,064 B2 | * | 5/2007 | Mehta | 310/331 |
| 7,343,802 B2 | * | 3/2008 | Yamashita | 73/514.34 |
| 2007/0063617 A1 | * | 3/2007 | Yamashita | 310/318 |

FOREIGN PATENT DOCUMENTS

| | | |
|---|---|---|
| DE | 19701334 | 10/1997 |
| EP | 1717500 | 11/2006 |
| JP | 59108378 | 6/1984 |
| WO | WO 89/07345 | 8/1989 |

* cited by examiner

*Primary Examiner* — Walter Benson
*Assistant Examiner* — Bryan P Gordon
(74) *Attorney, Agent, or Firm* — Hoffman & Baron, LLP

(57) ABSTRACT

An electronic control device for a piezo-ceramic bending transducer designed as a trimorph, wherein a first voltage divider consisting of two resistor branches and powered by a first voltage source ($U_{st1}$) is provided, whose first resistor branch connects the first piezo-ceramic plate of the trimorph to its spacer layer. In addition, a second voltage divider is provided that consists of two resistor branches and the first resistor branch thereof connects the second piezo-ceramic plate of the trimorph to its spacer layer. The second resistor branch of the first voltage divider also forms the second resistor branch of the second voltage divider. Thus, by means of one voltage source, the one piezo-ceramic plate has an applied tensile stress and the other piezo-ceramic plate has an applied compressive stress, so that the flexural motion is reinforced by the two piezo-ceramic plates and thus only a small voltage has to be applied.

20 Claims, 2 Drawing Sheets

ELECTRONIC CONTROL DEVICE FOR A PIEZO-CERAMIC BENDING TRANSDUCER DESIGNED AS A TRIMORPH

This application claims priority based on an International Application filed under the Patent Cooperation Treaty, PCT/EP2007/007119, filed Aug. 11, 2007.

BACKGROUND OF THE INVENTION

The invention pertains to an electronic control device for a piezo-ceramic bending transducer designed as a trimorph that consists of two piezo-ceramic plates with a passive spacer layer located in between.

With this kind of trimorph, in a known manner, for mechanical bending in the one direction, a voltage source is applied to the first piezo-ceramic plate, and for mechanical bending in the other direction, a voltage source is applied to the other piezo-ceramic plate. It is quite obviously also possible to apply the voltage from the voltage source either to the one or to the other piezo-ceramic plate by means of an associated switching gear. In all cases, the other particular piezo-ceramic plate will be passive.

One problem of the present invention is to activate both piezo-ceramic plates, one each for the mechanical bending process, but without having to increase the number of voltage sources.

SUMMARY OF THE INVENTION

This problem is solved according to the invention by a control device with the features of claim 1.

Due to the two voltage dividers, in a favorable manner a bipolar control of the trimorph is attained with only one voltage source, and both ceramic plates are active. Thus, tensile stresses are created in the one piezo-ceramic plate and compressive stresses are created simultaneously in the other piezo-ceramic plate due to opposing pole operation of this piezo-ceramic plate, so that the ceramic plate exposed to tensile stress is under a lesser load, firstly because a lesser voltage has to be applied, and secondly, because the other piezo-ceramic plate augments the bending process. Nonetheless, only one voltage source is needed for the bending process in the one direction.

Therefore, since each of the piezo-ceramic plates is under a reduced load, the service life is extended and reduced wear occurs.

Due to the measures enumerated in the dependent claims, favorable embodiments and improvements to the electronic control device cited in claim 1 are possible.

The first two resistor branches of the two voltage dividers each have preferably the series circuiting of a diode with a resistor element. Instead of the resistor element, in a favorable manner a Z-diode can also be provided, which forms an additional protection against over-voltages. The diode and the Z-diode are oppositely poled in this case. To achieve the desired, opposing voltages, the cathodes of the two diodes of the first two resistor branches are directly or indirectly connected to each other, for example, via a resistor.

For voltage-limiting or power limiting, an additional resistor element can be circuited between the first resistor branch and the piezo-ceramic plates.

In order to be able to carry out a bending motion in both directions, the second voltage divider can be connected to a second voltage source, wherein the voltage sources can be switched on alternately to generate the two opposing bending motions. Alternatively, the first voltage source can be switched so as to apply voltage to the first or to the second voltage divider, for example, by means of a changeover switch, so that even in bending motions in both directions, only one single voltage source is needed.

The trimorph is particularly suitable as a valve switching element of a valve. The required electronic components can be arranged preferably on a flex-conductor of the valve, and one such flex conductor is often provided in any case.

BRIEF DESCRIPTION OF THE DRAWINGS

Two design embodiments of the invention are illustrated in the figures and are described in greater detail below. Shown are.

DETAILED DESCRIPTION OF THE PREFERRED EMBODIMENTS

Figure 1:
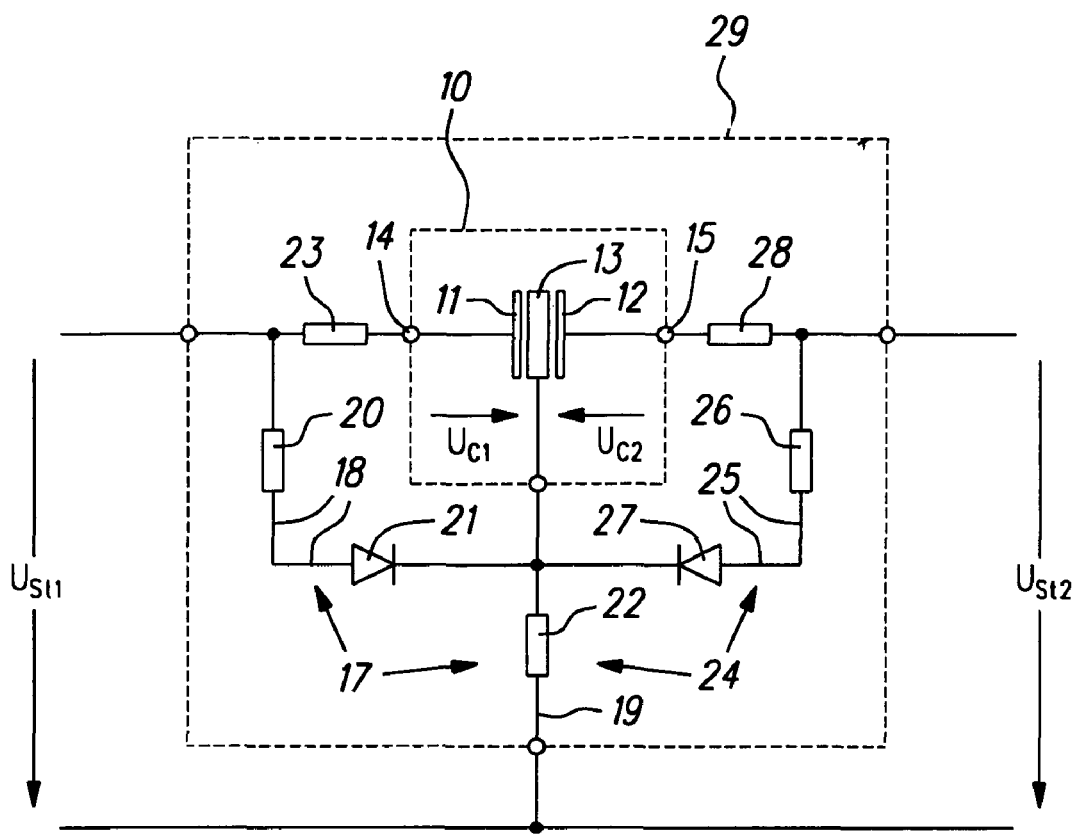
FIG. 1, the circuit diagram of a first design embodiment.

The piezo-ceramic bending transducer illustrated schematically in FIG. 1 and designed as a trimorph 10, consists in known manner of two piezo-ceramic plates 11, 12, between which a passive spacer layer 13 is arranged. The carrier material of the spacer layer 13 is usually glued to the piezo-ceramic plates 11, 12 or is secured thereon by other means. The trimorph 10 has three electric connections 14-16 corresponding to the number of piezo-ceramic plates 11, 12 and the passive spacer layer 13.

A first voltage divider 17 has two resistor branches 18, 19, and the first resistor branch 18 consists of a series circuited resistor element 20 with a diode 21, and the second resistor branch 19 consists of one resistor element 22. Other known embodiments of voltage dividers 17 are in principle also possible.

The power pick off of the voltage divider 17 between the resistor branches 18, 19 is connected to the passive spacer layer 13 via the electric connection 16. The other connector of the first resistor branch 18 is connected via an additional resistor element 23 and via the electrical connection 14 to the first piezo-ceramic plate 11.

A second voltage divider 24 in turn consists of two resistor branches 25, 19, and the first resistor branch 25 is symmetrical to the first resistor branch 18 of the first voltage divider 17 and likewise consists of the series circuiting of a resistor element 26 with a diode 27. Both voltage dividers 17, 24 have the same second resistor branch 19. The first resistor branch 25 of the second voltage divider 24 is connected accordingly, via one resistor element 28 and via the electrical connection 15 to the second piezo-ceramic plate 12.

The entire arrangement can be located, for example, in a fluidic valve 29, wherein the trimorph 10 forms the valve element. For example, the electronic components can be integrated onto a frequently already used flex-conductor of the valve 29, as is known from EP 1717500 A1. If the trimorph 10 is to perform only one bending movement in the one bending direction, then only one voltage source $U_{Sr1}$ need be applied to the first voltage divider 17. The voltage conditions in this case are presented in the left half of the diagram presented in FIG. 2. The voltage $U_{C1}$ herein is the voltage between the first piezo-ceramic plate 11 and the spacer layer 13, whereas the oppositely poled voltage $U_{C2}$ illustrated by dashed lines is the voltage between the second piezo-ceramic plate 12 and the spacer layer 13. Both voltages $U_{C1}$ and $U_{C2}$ are generated by means of the voltage source $U_{St1}$ and the two voltage dividers 17, 24, in that the voltage is elevated in the middle position by the voltage dividers 17, 24. Thus, a tensile stress is produced in the piezo-ceramic plate 11, whereas in the piezo-ceramic plate 12, a compressive stress is created, so that both piezo-ceramic plates 11, 12 cause a movement in the same bending direction.

If a second voltage source $U_{St2}$ is applied to the second voltage divider 24, while the first voltage source $U_{St1}$ is switched off, then the conditions are reversed and the trimorph 10 performs a bending motion in the opposite direction. The voltage conditions in this case are shown in the right half of FIG. 2.

The two diodes 21, 27 are oppositely poled, that is, their cathodes are connected together. This connection, of course, can also be handled indirectly via at least one resistor element. These diodes prevent a short circuit of the voltage $U_{St1}$ when $U_{St2}$ goes to 0, and vice versa.

If a bending motion of the trimorph 10 is needed in the two opposing bending directions, then instead of the two voltage sources $U_{St1}$ and $U_{St2}$, only one voltage source can be provided, which then is applied to the two voltage dividers 17 and 24 via an electric changeover switch (not illustrated).

The bending motion of the trimorph 10 in an embodiment as valve element, is necessary, for example, for a fluidic valve 29 designed as 3/2-way valve, whereas in a 2/2-way valve, only one bending motion in one bending direction is necessary.

Figure 3:
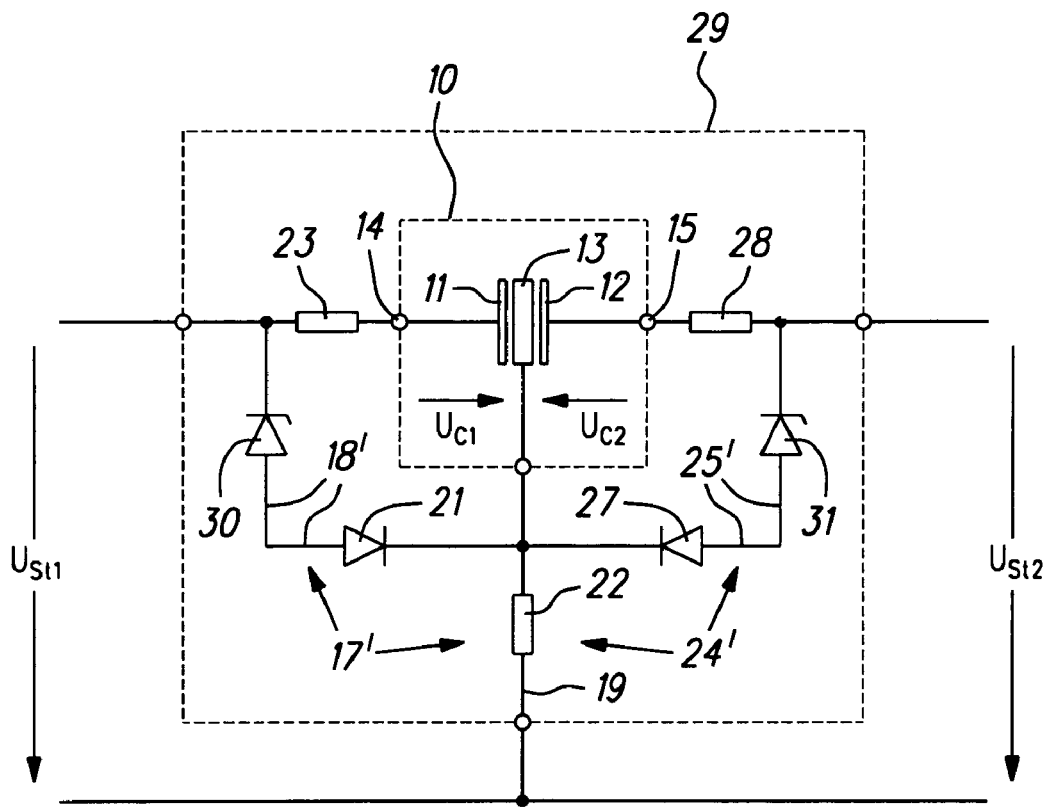
FIG. 3, the circuit diagram of a second design embodiment of the invention.

In the second design embodiment illustrated in FIG. 3, the same or equivalent components are provided with the same reference numbers and are not described again. In a modified, first voltage divider 17', instead of the first resistor branch 18, a modified first resistor branch 18' appears that has a Z-diode 30 instead of the resistor element 20. Accordingly, a modified first resistor branch 25' of the second modified voltage divider 24' has a Z-diode 31.

Figure 2:
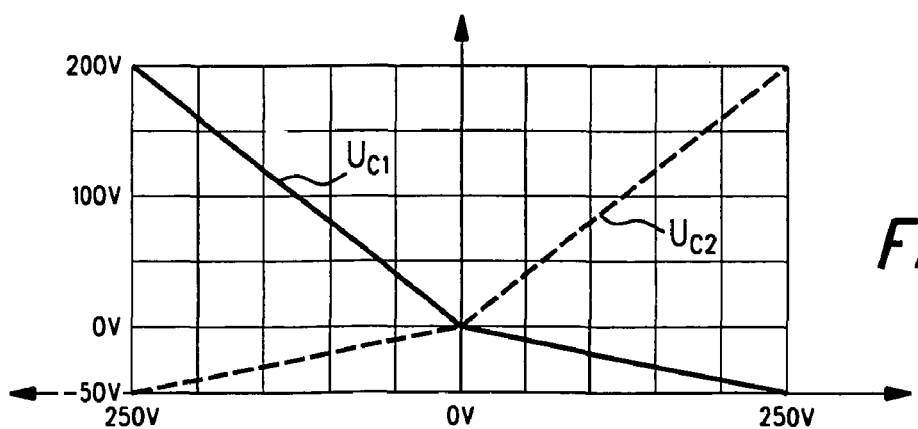
FIG. 2, a voltage diagram to explain the operation.
Figure 4:
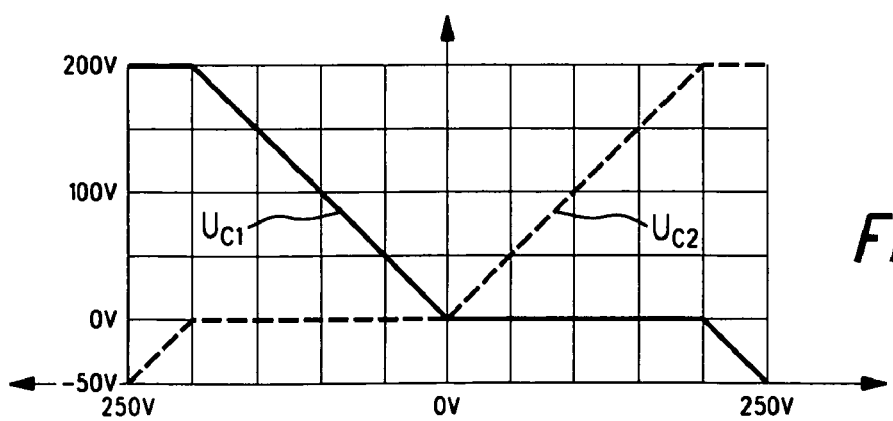
FIG. 4, a voltage diagram to explain the operation of the design embodiment illustrated in FIG. 3.

Due to the two Z-diodes 30, 31, the voltage profiles illustrated in FIG. 4 appear; as opposed to the voltage profiles in FIG. 2. The Z-diodes 30, 31 form an additional protection against over-voltages. The voltages $U_{C1}$ and $U_{C2}$ are limited to 200 V in both bending directions, wherein this value is of course intended merely as an example. The respective piezo-ceramic plate exerting a compressive stress is held constant up to a voltage of 200 V of the voltage source $U_{St1}$ or $U_{St2}$, and then drops to a value of −50 V. This means that the piezo-ceramic plate exerting the compressive stress is only activated to support the bending at voltages over 200 V. Due to selection of components of the voltage dividers 17, 24, the voltage conditions can be adjusted as desired.

The invention claimed is:

1. An electronic control device for a piezo-ceramic bending transducer designed as a trimorph and comprising two piezo-ceramic plates with a passive spacer layer located therebetween, with a first voltage divider comprising two resistor branches and powered by a first voltage source, wherein the first resistor branch connects the first piezo-ceramic plate to the spacer layer, and wherein a second voltage divider comprising two resistor branches has a first resistor branch that connects the second piezo-ceramic plate to the spacer layer, wherein the second resistor branch of the first voltage divider also forms the second resistor branch of the second voltage divider.

2. An electronic control device according to claim 1, wherein the two first resistor branches each have a series circuit of a diode with a resistor element.

3. An electronic control device according to claim 1, wherein the first two resistor branches each have the series circuit of a diode with a Z-diode.

4. An electronic control device according to claim 3, wherein the diodes and the Z-diodes are each oppositely poled.

5. An electronic control device according to claim 2, wherein the cathodes of the two diodes of the two first resistor branches are connected together either directly or indirectly.

6. An electronic control device according to claim 1, wherein a resistor element is circuited between the first resistor branches and the piezo-ceramic plates.

7. An electronic control device according to claim 1, wherein the second voltage divider can be connected to a second voltage source, wherein the voltage sources can be switched on alternately.

8. An electronic control device according to claim 1, wherein the first voltage source can be applied to and switched between the first or the second voltage divider.

9. An electronic control device according to claim 1, wherein the trimorph is designed as a valve switching element of a valve.

10. An electronic control device according to claim 9, wherein the electronic components are arranged on or are integrated into a flex-conductor of the valve.

11. An electronic control device according to claim 3, wherein the cathodes of the two diodes of the two first resistor branches are connected together either directly or indirectly.

12. An electronic control device according to claim 4, wherein the cathodes of the two diodes of the two first resistor branches are connected together either directly or indirectly.

13. An electronic control device according to claim 2, wherein a resistor element is circuited between the first resistor branches and the piezo-ceramic plates.

14. An electronic control device according to claim 3, wherein a resistor element is circuited between the first resistor branches and the piezo-ceramic plates.

15. An electronic control device according to claim 4, wherein a resistor element is circuited between the first resistor branches and the piezo-ceramic plates.

16. An electronic control device according to claim 5, wherein a resistor element is circuited between the first resistor branches and the piezo-ceramic plates.

17. An electronic control device according to claim 2, wherein the second voltage divider can be connected to a second voltage source, wherein the voltage sources can be switched on alternately.

18. An electronic control device according to claim 3, wherein the second voltage divider can be connected to a second voltage source, wherein the voltage sources can be switched on alternately.

19. An electronic control device according to claim 4, wherein the second voltage divider can be connected to a second voltage source, wherein the voltage sources can be switched on alternately.

20. An electronic control device according to claim 5, wherein the second voltage divider can be connected to a second voltage source, wherein the voltage sources can be switched on alternately.

* * * * *